United States Patent [19]
Yam et al.

[11] Patent Number: 5,863,883
[45] Date of Patent: Jan. 26, 1999

[54] SLURRY CLEANING PROCESS

[75] Inventors: Benny S. Yam, Holmdel; Robert C. Jorgensen, Cherry Hill; William E. Spears, Jr., Lawrenceville, all of N.J.

[73] Assignee: Church & Dwight Co., Inc

[21] Appl. No.: 722,461

[22] Filed: Sep. 27, 1996

Related U.S. Application Data

[60] Division of Ser. No. 370,641, Jan. 10, 1995, Pat. No. 5,593,339, which is a continuation-in-part of Ser. No. 105,406, Aug. 12, 1993, Pat. No. 5,384,990.

[51] Int. Cl.$^6$ .............................. C11D 3/06; C11D 1/66; C11D 3/10
[52] U.S. Cl. .................. 510/407; 451/36; 451/104; 451/910; 451/113; 451/488; 451/74; 451/165; 510/268; 510/175; 510/418; 510/258; 510/255; 510/435
[58] Field of Search .................. 451/36, 104, 910, 451/113, 488, 74, 165; 510/268, 175, 418, 258, 255, 435

[56] References Cited

U.S. PATENT DOCUMENTS

| | | | |
|---|---|---|---|
| 2,020,228 | 11/1935 | Ashton | 87/5 |
| 2,802,228 | 8/1957 | Federighi et al. | 15/95 |
| 2,824,029 | 2/1958 | Zinty | 134/23 |
| 2,901,383 | 8/1959 | Lebsanft et al. | 134/7 |
| 3,037,886 | 6/1962 | Ryznar | 134/4 |
| 3,484,995 | 12/1969 | Gordon | 51/8 |
| 3,535,159 | 10/1970 | Shiro | 134/1 |
| 3,581,440 | 6/1971 | McKinney et al. | 51/7 |
| 3,819,525 | 6/1974 | Hattenbrun | 252/132 |
| 4,125,969 | 11/1978 | Easton | 51/320 |
| 4,333,771 | 6/1982 | Altenschopfer et al. | 134/7 |
| 4,537,604 | 8/1985 | Dawson | 51/298 |
| 4,588,444 | 5/1986 | Anderson | 134/2 |
| 4,655,957 | 4/1987 | Chromecek et al. | 252/174.23 |
| 4,670,060 | 6/1987 | Su et al. | 252/174.17 |
| 4,724,853 | 2/1988 | Hirose | 134/1 |
| 4,771,580 | 9/1988 | Male | 51/439 |
| 4,802,312 | 2/1989 | Glaeser et al. | 51/321 |
| 4,804,488 | 2/1989 | Alvemarker | 252/544 |
| 4,806,333 | 2/1989 | Egerton et al. | 423/625 |
| 4,839,082 | 6/1989 | Bhatia | 252/174.12 |
| 5,017,238 | 5/1991 | Chromecek et al. | 134/7 |
| 5,081,799 | 1/1992 | Kirschner et al. | 51/410 |
| 5,083,402 | 1/1992 | Kirschner et al. | 51/319 |
| 5,160,547 | 11/1992 | Kirschner et al. | 134/7 |
| 5,226,969 | 7/1993 | Watanabe et al. | 134/7 |
| 5,316,587 | 5/1994 | Yam et al. | 134/7 |
| 5,317,841 | 6/1994 | Cook et al. | 51/321 |
| 5,322,532 | 6/1994 | Kurtz | 51/293 |
| 5,332,447 | 7/1994 | Winston et al. | 134/7 |
| 5,344,494 | 9/1994 | Davidson et al. | 134/7 |
| 5,384,989 | 1/1995 | Shibano | 451/36 |
| 5,384,990 | 1/1995 | Spears, Jr. | 451/38 |
| 5,575,705 | 11/1996 | Yam et al. | 451/39 |
| 5,593,339 | 1/1997 | Yam et al. | 451/36 |
| 5,605,491 | 2/1997 | Yam et al. | 451/50 |

FOREIGN PATENT DOCUMENTS

| | | |
|---|---|---|
| 5583560 | 6/1980 | Japan . |
| 248515 | 7/1989 | Russian Federation . |
| 90/11163 | 10/1990 | WIPO . |
| 91/15308 | 10/1991 | WIPO . |
| 93/21292 | 10/1993 | WIPO . |

OTHER PUBLICATIONS

CRC Handbook of Chemistry and Physics, 63rd ed, Robert C. Weast, ed., CRC Press, Inc., p. B–87, Month unknown 1982.

*Primary Examiner*—Paul Lieberman
*Assistant Examiner*—Charles Boyer
*Attorney, Agent, or Firm*—Irving Fishman

[57] ABSTRACT

A method of cleaning a solid surface which is particularly effective for a surface having a complicated structure including slots and holes comprises immersing the solid surface in a cleaning slurry comprising a cleaning liquid and abrasive particles which are soluble in the cleaning liquid, the cleaning liquid comprising a saturated solution so as to greatly reduce the dissolution of the abrasive particles in the cleaning liquid.

9 Claims, 1 Drawing Sheet

SLURRY CLEANING PROCESS

This application is a division of application Ser. No. 08/370,641, filed Jan. 10, 1995 now U.S. Pat. No. 5,593,339, which is a Continuation-in-Part application of U.S. patent application Ser. No. 08/105,406, filed Aug. 12, 1993, now U.S. Pat. No. 5,384,990.

BACKGROUND OF THE INVENTION

The present invention is directed to processes for cleaning a solid surface and, in particular, processes for cleaning a part such as a metal workpiece, a printed circuit board and the like, utilizing an aqueous cleaning slurry.

Parts washers of various kinds are known to those skilled in the art as having great utility for mechanics and others working in a variety of occupations, particularly those working in industrial plants, maintenance and repair services, and the like. The parts washers referred to herein include soak tanks, so-called hot tanks, immersion type parts cleaners with or without air agitation, spray washers (continuous or batch) and ultrasonic baths. Generally, parts washers are used to remove all types of contaminants adhered to a solid surface such as metal including such contaminants as greases, cutting fluids, drawing fluids, machine oils, antirust oils such as cosmoline, carbonaceous soils, sebaceous soils, particulate matter, waxes, paraffins, used motor oil, fuels, etc.

Until recently, metal surfaces were cleaned of most oily and greasy contamination in such parts washers as referred to above by use of organic solvents. Existing solvents, with or without special additives, are adequate to achieve good cleaning of most dirty, greasy, metal parts. A great number of solvents have been employed to produce metallic surfaces free from contamination. These wash solvents generally include various hydrocarbons and halogenated hydrocarbons. The degree of success achieved with each of these wash solvents is generally dependent upon the degree of cleanliness required of the resultant surface.

Recently, however, the various hydrocarbon and halogenated hydrocarbon cleaning solvents previously employed have come under scrutiny in view of the materials employed, and in particular, the environmental, health and safety impacts from the usage of the various materials. Thus, although the halogenated hydrocarbon solvents such as chlorofluorocarbons (CFCs) and trichloromethane, methylene chloride and trichloroethane (methyl chloroform) are widely used in industry for cleaning, their safety, environmental and cost factors coupled with waste disposal problems are negative aspects in their usage. A world-wide and U.S. ban on most halogenated hydrocarbon solvents is soon in the offing by virtue of the Montreal Protocol, Clean Air Act and Executive and Departmental directives. The hydrocarbon solvents such as toluene and Stoddard solvent and like organic compounds such as ketones and alcohols on the other hand are generally flammable, have high volatility and dubious ability to be recycled for continuous use. These, plus unfavorable safety, environmental and cost factors, put this group of solvents in a category which is unattractive for practical consideration. Most useful organic solvents are classified as volatile organic compounds (VOCs) which pollute the atmosphere, promote formation of toxic ozone at ground level, and add to the inventory of greenhouse gases.

Alternative processes have been developed for removing contaminants from solid surfaces other than the use of organic solvents. Among such alternatives include blast cleaning processes in which an abrasive is directed against a contaminated surface by means of a pressurized fluid stream such as air or water. Unfortunately, hard abrasives such as sand, aluminum oxide, steel shot and the like may actually harm the underlying surface during treatment. Not only metal surfaces but nonmetallic surfaces such as glass or silicone such as used to form printed circuit boards have also been cleaned of contaminants comprising oils, greases, waxes, fluxes and the like using a blast cleaning process in which the blast medium comprises fine particles of dry ice. While such methods are readily useful in affecting the cleaning of parts having relatively uniform shapes or flat boards, such methods cannot easily clean the whole surface of a printed circuit board on which many electronic parts are mounted, or parts having complicated structures or containing holes since it is not easy to direct the motion of the blast medium to effectively reach such surfaces.

Water blasting systems have been used in which the water blast stream contains insoluble abrasive particles. Besides causing possible harm to the surface of the substrate due to the abrasive action of the hard particles as described above, such water blasting process often leaves residues of fine insoluble particulates on the substrate. If the substrate is of complex configuration, contains holes or includes precision moving parts, it is obvious that the presence of the particulate residues can degrade the usefulness of the part and possibly harm the part during use thereof. It is known, however, to utilize water soluble abrasives in the water blast stream. While the use of the water soluble abrasives eliminates the problem of insoluble residues remaining on the part inasmuch as the parts can be washed with water to dissolve any remaining particulate abrasive, the wet blast process itself like the purely dry blast process is equipment intensive requiring containment means such as blast cabinets or blast room installation, compression equipment, supply hoppers, hoses and nozzles and means to accurately dispense the abrasive into the pressurized fluid stream and is labor intensive. Further, if water soluble abrasives are used in a pressurized water stream, the problem of abrasive solubility and maintaining abrasive particle size to clean effectively poses further problems. This latter problem has been overcome by using a fluid stream comprising a saturated solution to limit abrasive solubility in the fluid stream and maintain abrasive particle integrity. Copending, commonly assigned U.S. Ser. No. 105,406, filed Aug. 12, 1993, now U.S. Pat. No. 5,384,990 and Continuation-in-part application (Docket 23693A) filed concurrently herewith describe water blasting with a water soluble abrasive contained in a saturated solution.

Another alternative cleaning process provided to eliminate the various negative aspects of the known organic solvent washing and degreasing systems, involves the use of aqueous detergent systems. Unfortunately, aqueous cleaning systems are not without their own problems. For example, certain of the aqueous cleaners are exceedingly alkaline having pHs of 13 and above such as sodium hydroxide or include organic solvents such as alkanolamine, ethers, alcohols, glycols, ketones and the like. Besides being highly corrosive, the exceedingly high alkaline aqueous solutions are highly toxic and can be dangerous to handle requiring extreme safety measures to avoid contact with skin. Organic solvent-containing aqueous cleaners present the problems regarding toxicity, volatility or the environment as expressed previously. On the other hand, it is most difficult to obtain an aqueous detersive solution at moderate pH which is effective in removing greases and oils and other hard to clean soils and the like and which would not be corrosive such as to metal substrates. Further, to provide effective cleaning using aqueous detersive solutions at moderate pH, it is often necessary to utilize high temperatures well upwards of 150° F. and typically approaching 170°–195° F. Obviously, the use of such elevated temperatures, long residence times and additional vigorous mechanical cleaning such as brushing, spraying, blasting adds costs to the cleaning method.

Still another alternative to the mere use of organic solvents is described in U.S. Pat. No. 5,226,969. In this patent, there is disclosed an apparatus for cleaning a solid surface which comprises a cleaning bath containing a cleaning liquid which contains insoluble particles and further includes means for bringing the cleaning liquid into an eddy-flow state. The insoluble particles may be particles such as glass, silicon, alumina, calcium carbonate and cerium oxide. The liquid can include pure or deionized water, a detergent and an organic solvent. The means for bringing the cleaning liquid into an eddy-flow state may be a stirring apparatus or a vibration generating apparatus and the like. The problem with this cleaning procedure is the use of insoluble abrasives. Thus, abrasives which are very hard, can actually harm the underlying surface which is to be cleaned. Further, as previously stated, particles of the insoluble abrasive may remain in the crevices of a substrate which has a complicated structure. This residue of abrasive particles may actually cause damage to the substrate being cleaned during use. For example, a precision part or a printed circuit board may actually fail during use due to the pressure of a residue of insoluble abrasives.

An object of the present invention is to provide a cleaning system which overcomes the environmental, safety and health hazards found in purely organic solvent cleaning systems.

Another object of the present invention is to provide a cleaning system which is safe to use, not a hazard to the environment and requires reduced labor, equipment and energy costs relative to the concerns and costs associated with previous organic solvent cleaning, aqueous detergent cleaning and abrasive blast cleaning processes.

Another object of the present invention is to provide a cleaning system which can readily clean complicated parts and surfaces which have variegated structure, holes, slots and the like.

Still another object of the present invention is to provide an aqueous based cleaning system which can be used to effectively clean contaminants from surfaces at neutral to moderate pH and which any residues of the cleaning system can be readily removed with an aqueous rinse.

These and other objects of the invention can be readily discerned from a description of the invention which is set forth in more detail below.

SUMMARY OF THE INVENTION

In accordance with the present invention, a novel cleaning slurry is provided comprising a cleaning liquid having mixed therein abrasive particles which are soluble in the cleaning liquid. The soluble abrasive particles maintain their integrity by formulating the cleaning liquid as a saturated solution so as to greatly reduce if not eliminate substantial dissolution of the abrasive particles. The use of the cleaning slurry to clean contaminated parts is preferably achieved by agitating the slurry so as to bring the liquid into an eddy-flow state and cause the particles of abrasive to scrub and scour the surface of the substrate part contacted with the slurry.

The cleaning liquid which forms the slurry can be selected from the group consisting of pure water, an aqueous based detergent system comprising builder salts and/or surfactants or organic solvents or even a purely organic solvent based liquid. Obviously, it is prudent to reduce the amount of organic solvent in the cleaning system in view of the problems enumerated above, although the present invention is not meant to exclude the use of organic solvents. Abrasives that are to be used are to be soluble in the cleaning liquid. If the cleaning liquid is water or an aqueous detergent system, the abrasives should be water soluble. Particularly useful abrasives are alkali metal carbonates and bicarbonates. If such materials are utilized to form the saturated aqueous solution, advantages are obtained by the addition of alkalinity to the cleaning liquid and the known builder effects of these alkali metal carbonate and bicarbonate materials.

The agitation of the cleaning slurry and the formed turbulence and scouring action of the abrasive therein can be achieved by various means including sparging a gas through the slurry, mechanical agitating means such as a stirring apparatus, spray nozzles and even by vibrating the slurry. Although the temperature of the cleaning slurry can be elevated, it is believed that the scouring action of the abrasive particles in the slurry enhances the cleaning effect of the cleaning liquid such that elevated temperatures typically used for aqueous cleaning systems may not be required and, along with reduced residence times, substantially decreases the energy and total production costs.

BRIEF DESCRIPTION OF THE DRAWINGS

The FIGURE is a schematic drawing of a typical apparatus which can be used to clean a contaminated surface with the cleaning slurry bath of this invention.

DESCRIPTION OF THE PREFERRED EMBODIMENTS

Figure 1:
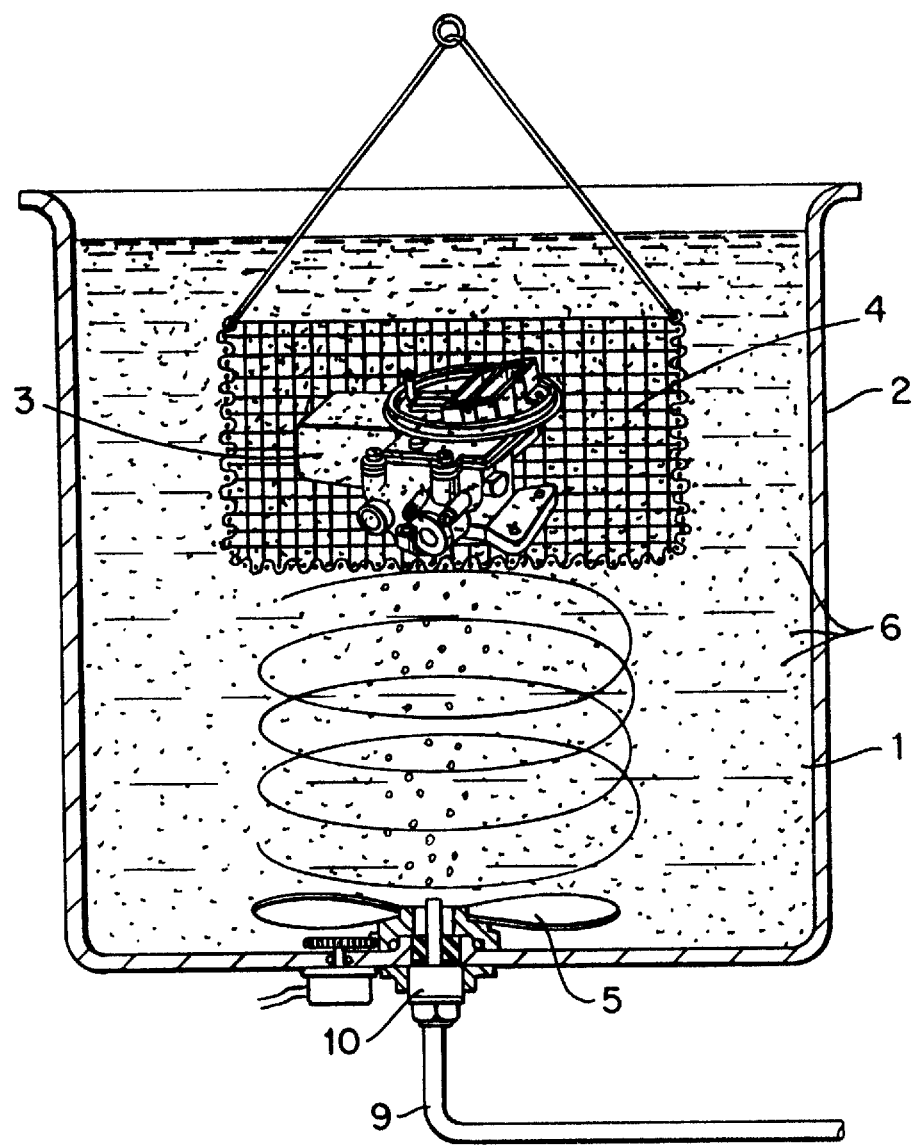

The present invention is directed to a novel process for cleaning a solid surface utilizing a cleaning slurry in the form of a cleaning bath containing a cleaning liquid and abrasive particles which are soluble in the cleaning liquid. The cleaning liquid comprises a saturated solution to not only reduce dissolution of the abrasive particles but also enhances crystal growth and maintenance of a functional crystal size for the abrasive particles. The process comprises bringing the cleaning slurry into an eddy-flow state so that the abrasive particles contact and scour the surface of a contaminated part immersed in the slurry.

The present invention is also directed to the cleaning slurry bath comprising a cleaning liquid in the form of a saturated solution and abrasive particles soluble in the cleaning liquid.

The cleaning liquid of the cleaning slurry bath of the present invention is preferably water. The cleaning liquid such as water can also be modified to enhance the detersive efficacy of the cleaning liquid. Thus, if the cleaning liquid is water, soluble alkalinity providing agents and soluble or readily dispersible surfactants can be added to aid in the removal of the contaminants from the substrate which is immersed in the slurry.

The alkalinity providing agents which can be added to the aqueous cleaning liquids of the present invention can be provided by one or more water soluble alkaline salts. Most suitable are the water soluble salts of potassium and sodium. Especially preferred are the potassium and sodium carbonates and bicarbonates which are economical, safe and environmentally friendly. The carbonate salts include potassium carbonate, potassium carbonate dihydrate, potassium carbonate trihydrate, sodium carbonate, sodium carbonate decahydrate, sodium carbonate heptahydrate, sodium carbonate monohydrate, sodium sesquicarbonate and the double salts and mixtures thereof. The bicarbonate salts include potassium bicarbonate and sodium bicarbonate and mixtures thereof. Mixtures of the carbonate and bicarbonate salts are also especially useful.

Although not preferred, other suitable alkaline salts which can be used include the alkali metal ortho or complex phosphates. The complex phosphates are especially effective because of their ability to chelate water hardness and heavy metal ions. The complex phosphates include, for example, sodium or potassium pyrophosphate, tripolyphosphate and hexametaphosphates. Additional suitable alkaline salts useful as additives in the aqueous cleaning liquids of this invention include the alkali metal borates, sulfates, acetates, citrates, tartrates, succinates, silicates, phosphonates, edates, etc.

The alkaline salts described above can also be used to form the saturated solution of the cleaning liquid of this invention. The amount of the alkaline salts added to the cleaning liquid such as water to form the saturated solution will of course depend upon the solubility of the particular salt. Well known and published handbooks are readily available to determine how much of a particular salt is needed to form the saturated solution.

It may also be useful to include surfactants in the aqueous cleaning liquid to improve cleaning efficacy. Nonionic surfactants are preferred as such surfactants are best able to remove the dirt, grease and oil which contaminate many substrates.

Among the useful surfactants in view of the ability thereof to remove grease and oil are the nonionic alkoxylated thiol surfactants. The nonionic alkoxylated (ethoxylated) thiol surfactants are described, for example, in U.S. Pat. Nos. 4,575,569 and 4,931,205, the contents both of which are herein incorporated by reference. Another useful surfactant which can be used comprise those derived from N-alkyl pyrrolidone. Particularly preferred is N-(N-alkyl)-2-pyrrolidone wherein the alkyl group contains 6–15 carbon atoms. These compounds are described in U.S. Pat. No. 5,093,031 and is herein incorporated by reference.

Suitable non-ionic surfactants include the polyoxyethylene-polyoxypropylene condensates, which are sold by BASF under the tradename "Pluronic", polyoxyethylene condensates of aliphatic alcohols/ethylene oxide condensates having from 1 to 30 moles of ethylene oxide per mole of coconut alcohol; ethoxylated long chain alcohols sold by Shell Chemical Co. under the tradename "Neodol", polyoxyethylene condensates of sorbitan fatty acids, alkanolamides, such as the monoalkanolamides, dialkanolamides and the ethoxylated alkanolamides, for example coconut monoethanolamide, lauric isopropanolamide and lauric diethanolamide; and mine oxides for example dodecyldimethylamine oxide.

Examples of suitable anionic surfactants are water-soluble salts of the higher alkyl sulfates, such as sodium lauryl sulfate or other suitable alkyl sulfates having 8 to 18 carbon atoms in the alkyl group, water-soluble salts of higher fatty acid monoglyceride monosulfates, such as the sodium salt of the monosulfated monoglyceride of hydrogenated coconut oil fatty acids, alkyl aryl sulfonates such as sodium dodecyl benzene sulfonate, higher alkyl sulfoacetates, higher fatty acid esters of 1,2-dihydroxy propane sulfonate, and the substantially saturated higher aliphatic acyl amides of lower aliphatic amino carboxylic acid compounds, such as those having 12 to 16 carbons in the fatty acid, alkyl or acyl radicals, and the like. Examples of the last mentioned amides are N-lauroyl sarcosinate, and the sodium, potassium, and ethanolamine salts of N-lauroyl, N-myristoyl, or N-palmitoyl sarcosinate sold by W. R. Grace under the tradename "Hamposyl". Also effective are polycarboxylated ethylene oxide condensates of fatty alcohols manufactured by Olin under the tradename of "Polytergent CS-1".

The surfactant can be present in amounts which vary widely and will depend upon the substrate being cleaned and the contaminant needed to be removed from the substrate. Thus, amounts as little as 0.1 wt. % up to 30 wt. % of the cleaning liquid can be utilized. At the higher amounts of surfactant, the instances of foaming may be increased and accordingly, low foaming surfactants are preferred. Additionally, antifoam agents can be included in the cleaning liquid to suppress the formation of foam, in particular, during agitation of the slurry during cleaning.

The cleaning liquid may also contain other additives which either improve the cleaning efficacy of the slurry or provide a useful post treatment to the substrate being cleaned. Thus, the cleaning slurry can include a hydrotrope which maintains the surfactant or any other organic adjuvant in aqueous solution or finely dispersed throughout the aqueous cleaning liquid. A particularly useful hydrotrope is an alkali metal salt of a $C_7$ to $C_{13}$ monocarboxylic acid. Sodium octanoate and sodium nonanoate are particularly preferred.

The cleaning liquid may contain a corrosion inhibitor to provide corrosion protection to metal substrates. A particularly useful corrosion inhibitor comprises alkali metal silicates. Cleaning liquids at lower pH, however, may require other corrosion inhibitors inasmuch as the silicates will precipitate from aqueous solution at pHs of below 9. Magnesium ions and, in particular, magnesium oxide when in aqueous solution with carbonate and/or bicarbonate salts is particularly useful as a corrosion inhibitor for metal substrates. Alkali metal orthophosphates have been found useful in reducing coloration of zinc-containing surfaces.

Additional adjuvants which can be added to the cleaning liquid include sanitizers, rinse aids such as anionic surfactants and magnesium oxide which improve the removal of any water soluble residue from the substrate, anionic polymer stabilizers to maintain silicates in solution, etc.

The cleaning liquid also contains abrasive particles dispersed therein to form the cleaning slurry bath. In operation, the abrasive particles are caused to collide with and scrub and scour a contaminated surface by virtue of kinetic energy imparted to the slurry, thereby cleaning the surface. The amount of abrasive particles contained in the slurry may effect the time needed for cleaning. Thus, the use of a large amount of abrasive particles may shorten the cleaning time. However, the composition of the cleaning liquid can be formulated as described above to have a considerable effect on the cleaning capability of the slurry. Thus, if the cleaning liquid contains alkaline salts and/or nonionic surfactants, the cleaning liquid itself may provide considerable cleaning in addition to the scouring effect of the abrasive particles.

The abrasive particles to be added to the cleaning liquid are soluble in the cleaning liquid. In the preferred embodiment, the abrasive particles are therefore water soluble. The abrasive particles typically will have an average size ranging from about 10–1,000 microns in diameter, preferably, from about 50–500 microns. The water soluble abrasive particles are advantageous since any residue of the water soluble particles can be readily rinsed off of the cleaned surface, can be readily disposed of by a water stream, readily separated from the dirt, grease, oils, insoluble paints and resins which have been removed from the substrate, and, since most water soluble abrasives are relatively soft, i.e., Mohs hardness of less than 4.0, such abrasive media can be utilized to remove grease, dirt, oil and the like from a variety of substrates including hard metals such as steel and, importantly, relatively soft metals such as aluminum as well as plastic, ceramic, concrete, wood and composites of such materials.

Nonlimiting examples of water soluble abrasives which can be utilized in the cleaning slurry of this invention include the alkali metal and alkaline earth metal salts such as the chlorides, chlorates, carbonates, bicarbonates, sesquicarbonates, sulfates, silicates and hydrates of the above, etc. The preferred abrasive particles are alkali metal salts, and, in particular, sodium and potassium carbonates, bicarbonates, sesquicarbonates and sulfates. The most preferred abrasive particles to be incorporated into the cleaning slurry of this invention are the alkali metal bicarbonates as exemplified by sodium bicarbonate. Generally, the cleaning slurry of the present invention will comprise from about 5 to about 50 wt. % of the abrasive particles as solids. A more preferred range would be from about 15 to 40 wt. % solids.

The cleaning liquid contained in the cleaning slurry of the present invention comprises a saturated solution, preferably formed from the same salt which forms the abrasive particles. The saturated solution forming the cleaning liquid insures that the abrasive particles which are added to the cleaning liquid to enhance the cleaning efficacy thereof do not readily dissolve and retain the geometry and abrasive nature thereof during the cleaning process. Moreover, the saturated solution containing dissolved abrasive salts can be manipulated such as by cooling or heating to dissolve more salt and then cooling to enhance crystal growth of the abrasive and maintain the abrasive at a functional size. The relative dissolution of the salts, such as the abrasive salts described above, in water are readily obtainable from published literature. For example, saturated solutions of sodium bicarbonate in water will comprise from about 7–20 wt. % of sodium bicarbonate depending upon the temperature of the water. If sodium carbonate or potassium carbonate are utilized to form the saturated solution, substantially higher levels of these materials must be dissolved in the water bath to obtain a saturated solution. The water bath can alternatively be saturated with dissolved salts other than those which form the abrasive particles to form the slurry.

Further, to maintain the integrity of the abrasive particles in the cleaning slurry at a functional size, the slurry may contain recrystallization agents which are believed to maintain an equilibrium abrasive particle size in the slurry cleaning during the cleaning process. Recrystallization agents which can be used are any of those known for use in water and include, for example, sodium hexametaphosphate and sodium polyacrylate.

In another aspect of the present invention, it is necessary to maintain the cleaning slurry in an agitated state such that kinetic energy is applied to the abrasive particles in the slurry whereby the moving abrasive particle contact and thereby scrub and scour the substrate surface which is immersed in the cleaning slurry so as to remove contaminants therefrom.

A stirring apparatus, a vibration generating apparatus or the like can be used as the means for providing an eddy flow in the cleaning liquid and thus provide movement of the abrasive particles against the substrate being cleaned. Other means for forming an eddy flow in the cleaning liquid includes means for sparging a gas such as air through the cleaning liquid and combinations of the above means to form an eddy flow. Moreover, liquids and even a portion of the slurry may be directed by nozzles from beneath the slurry to move the abrasive particles against the substrate being cleaned.

The cleaning slurry can be at any useful temperature which aids in the cleaning of the substrate. Thus, it has been found that with the addition of the abrasive particles, the cleaning liquid does not have to be at as high a temperature as would be required for cleaning if the abrasive particles were not present. Typical aqueous cleaning solutions are used at temperatures of greater than 150° F. and, more typically, at temperatures approaching 190° F. The cleaning slurry of the present invention is effective at room temperature, although elevated temperatures may improve the efficacy of the cleaning liquid to clean contaminants from the substrate. Thus, while temperatures of up to 190° F. are certainly useful, it is more preferred to utilize lower temperatures ranging from about room temperature to below 150° F. and still maintain effective cleaning.

The present invention can be described below with reference to the FIGURE which represents, in general, the process of the invention. Obviously, other apparatus configurations can be used to hold the substrate in the slurry bath and/or provide agitation.

As shown in the FIGURE, an apparatus for cleaning a solid surface using the process of the present invention includes a cleaning liquid 1, a cleaning bath 2, a part to be cleaned 3, a cage 4 in which the part 3 is placed, a stirring apparatus 5, fine abrasive particles 6, a gas supply 9 and a bubble generator 10.

In operation, the part 3 which is to be cleaned and having a surface provided with a complicated shape is placed in the cage 4 which has a mesh structure or the like so as to prevent the cage 4 from interrupting the flow of the cleaning liquid 1 and abrasive particles 6. The cage 4 containing part 3 is immersed in the cleaning liquid 1 containing the fine particles 6 in the cleaning bath 2. The cleaning bath 2 is equipped with a stirring apparatus 5 such as a rolling fan for causing the cleaning liquid 1 to flow and cause a liquid current by rotation. The fine particles 6 contained in the cleaning liquid 1 are moved with the liquid current and caused to collide with the surface of the part 3 by virtue of inertia so as to separate contaminants adhering to the surface of the part 3 and entrap the contaminant in the cleaning liquid 1. The stirring apparatus 5 can preferably be operated to control the rotational speed, rotational direction and the angle with respect to the part 3 for specifically directing the liquid flow to a particular location on part 3. The cleaning apparatus may be provided with a gas supply 9 for supplying bubbles in the cleaning liquid 1 and a bubble generator 10 for generating fine bubbles of gas by employing ultrasonic waves to provide kinetic energy and flow to the abrasive particles, both of which are provided together with the stirring apparatus 5 or in place of the apparatus 5 so that the cleaning efficiency in the bath 2 can be further increased.

Although a batch process is shown in the FIGURE, a continuous cleaning process may be provided. In such a process, a small amount of the slurry is continuously removed from the bath including that portion of the slurry which contains the dispersed debris including dirt, grease, oil, etc. removed from the part being cleaned. Simultaneously, the slurry in the cleaning bath can be continuously replenished from a new supply. Alternatively, the spent and dirty slurry which is removed can itself be processed to regenerate a clean slurry such as by separation techniques in which the lighter contaminants are skimmed from the surface of the slurry, where the abrasive particles are separated from the cleaning liquid and themselves washed to remove any adhered contaminants, and the abrasive particles and cleaning liquid recombined and recycled to the cleaning slurry bath.

Moreover, the cleaning slurry bath can be periodically removed from the bath so as to enhance the crystal size of the abrasive particles such as by manipulating the temperature of the removed slurry or by the addition of recrystallization agents therein.

The slurry baths of the present invention are useful for removing any type of contaminant from a surface including greases, cutting fluids, drawing fluids, machine oils, antirust oils such as cosmoline, carbonaceous soils, sebaceous soils, particulate matter, waxes, paraffins, used motor oil, fuels, etc. Any surface can be cleaned including iron-based metals such as iron, iron alloys, e.g., steel, tin, aluminum, copper, tungsten, titanium, molybdenum, etc., ceramics, plastics and composites. The structure of the surface to be cleaned can vary widely and is unlimited. Thus, the surface can be as a part of complex configuration, sheeting, coils, rolls, bars, rods, plates, disks, etc. The objects to be cleaned can be derived from any source including for home use, for industrial use such as from the aerospace industry, automotive industry, electronics industry, etc.

The process of this invention is particularly useful for high volume applications involving remanufacturing parts or equipment where very dirty, used and salvaged parts and systems must be cleaned before they can be disassembled, inspected and rebuilt. Auto parts rebuilders, heavy machinery reconditioners, machine tool manufacturers, airline industry, railroads, trucklines, commercial vehicle leasing and military bases and depots are all examples of users or facilities that can benefit from the use of the process disclosed herein.

The active ingredients of the slurry cleaning bath including the abrasive particles, any salt used to form the saturated solution and adjuvants such as to enhance the cleaning efficacy of the slurry or provide a post treatment characteristic to the cleaned substrate can be provided as a single dry mix package or as a two component package in which the particulate matter including abrasive and salt to form the saturated solution can be provided as one component and any liquid adjuvants such as surfactants, disinfectants, corrosion inhibitors, antifoam agents, hydrotropes, etc. may be provided as a concentrated aqueous solution. Each package would simply be added to the bath which holds water. In a continuous process, there may be a continuous feed of the active ingredients to the water or other liquid stream which forms the cleaning liquid.

EXAMPLE 1

A vessel containing 20 gallons of water is fitted with a stirring device which is secured to the bottom of the vessel. The water in the vessel is heated to 120° F. To the heated water is added 25 lbs of sodium bicarbonate having an average diameter of 150 microns. The stirring apparatus is set to rotate at 100 rpm to dissolve the sodium bicarbonate in the water and form a saturated solution which contains slightly less than 14 wt. % of the sodium bicarbonate relative to the water. After 1 minute of stirring, most of the sodium bicarbonate is dissolved In the water although there remains a small percentage of particles which are not dissolved. 50 lbs of sodium bicarbonate particles having an average diameter of 150 microns are then added to the heated saturated solution. The resulting slurry contains approximately 20 wt. % undissolved solids.

A dirty carburetor containing grease, oil and baked on particulates is placed in a wire mesh cage which is lowered into the slurry contained in the vessel. The stirring apparatus is now set at 200 rpm. The slurry appears to be in agitation with the particles being directed against the carburetor contained in the wire mesh cage. The slurry temperature is maintained at 120° F. After 10 minutes, the cage is pulled from the slurry and the carburetor inspected. The carburetor is clean except for small dirty patches which can be easily removed with a cloth.

EXAMPLE 2

The same procedure as above is utilized except that 3 lbs of a nonionic surfactant, Neodol 1–5 from Shell Oil Co. is added to the slurry. The temperature of slurry and the rotation of the stirring apparatus at the bottom of the vessel are maintained as in Example 1. As in Example 1, a dirty carburetor is immersed in the slurry bath by means of the wire mesh cage. After 8 minutes, the carburetor is removed from the bath and inspected. Substantially all of the contaminants have been cleaned from the carburetor. Small patches of grease which remain are easily removed with a cloth.

What is claimed is:

1. A cleaning slurry bath comprising: a bath of a cleaning liquid and dispersed therein abrasive particles which are soluble in said cleaning liquid, said abrasive particles comprising water soluble alkaline salts of alkali metal carbonates, bicarbonates or mixtures thereof, said cleaning liquid comprising a saturated solution so as to substantially inhibit the dissolution of said abrasive particles in said cleaning liquid, said cleaning liquid further includes adjuvants which are soluble or readily dispersable in said cleaning liquid and which aid in the cleaning of contaminants from a solid surface.

2. The cleaning slurry bath of claim 1 wherein said cleaning liquid is water.

3. The cleaning slurry bath of claim 2 wherein said cleaning liquid is alkaline.

4. The cleaning slurry bath of claim 1 wherein said adjuvants comprise at least one surfactant.

5. The cleaning slurry bath of claim 4 wherein said at least one surfactant is a nonionic surfactant.

6. The cleaning slurry bath of claim 1 wherein said adjuvant is a recrystallization agent.

7. The cleaning slurry bath of claim 1, wherein the water soluble alkaline salt abrasive particles comprise sodium bicarbonate, potassium bicarbonate, sodium carbonate, potassium carbonate or mixtures thereof.

8. The cleaning slurry bath of claim 1, wherein said adjuvants comprise a corrosion inhibiting agent.

9. The cleaning slurry bath of claim 8, wherein said corrosion inhibiting agent comprises magnesium oxide, an orthophosphate or mixtures thereof.

* * * * *